United States Patent [19]

Chu

[11] Patent Number: 5,691,236

[45] Date of Patent: Nov. 25, 1997

[54] METHOD AND APPARATUS FOR PERFORMING CHEMICAL VAPOR DEPOSITION

[75] Inventor: Hsin-Kun Chu, Hsinchu Hsien, Taiwan

[73] Assignee: United Microelectronics Corporation, Taiwan

[21] Appl. No.: 706,699

[22] Filed: Sep. 6, 1996

[30] Foreign Application Priority Data

Jun. 29, 1996 [TW] Taiwan ................................ 85107902

[51] Int. Cl.⁶ .................................................. H01L 21/443
[52] U.S. Cl. .......................... 437/194; 437/228; 437/248; 427/255.2; 427/255.3
[58] Field of Search ........................... 437/194, 228, 437/235, 238, 248; 417/314, 255.3, 255.2; 118/719

[56] References Cited

U.S. PATENT DOCUMENTS

| | | |
|---|---|---|
| 4,951,601 | 8/1990 | Maydan et al. ................ 118/719 |
| 5,124,014 | 6/1992 | Foo et al. . |
| 5,259,881 | 11/1993 | Edwards et al. ................ 118/719 |
| 5,512,320 | 4/1996 | Turner et al. ................... 427/255 |

*Primary Examiner*—John Niebling
*Assistant Examiner*—C. Everhart
*Attorney, Agent, or Firm*—Rabin, Champagne & Lynt, P.C.

[57] ABSTRACT

An apparatus and method for performing a chemical vapor deposition (CVD) procedure to deposit an insulating layer when fabricating semiconductor integrated circuit devices over a silicon wafer. The CVD apparatus includes a buffer chamber for temporarily holding the wafer, and a chemical vapor deposition reaction chamber arranged at the periphery of the buffer chamber and communicating with the buffer chamber via a first access door. The CVD apparatus additionally includes a heating chamber, also arranged at the periphery of the buffer chamber, and communicating with the buffer chamber via a second access door, for performing a heating treatment of the wafer before the insulating layer is deposited on the wafer in the CVD reaction chamber. A transport arm is provided for transporting the wafer into and out of the heating chamber and the chemical vapor deposition reaction chamber.

7 Claims, 3 Drawing Sheets

METHOD AND APPARATUS FOR PERFORMING CHEMICAL VAPOR DEPOSITION

BACKGROUND OF THE INVENTION

1. Field of the Invention

The invention relates in general to a method and apparatus for performing chemical vapor deposition (CVD) as part of the fabrication of a semiconductor integrated circuit (IC) device. In particular, the invention relates to a method and apparatus for performing CVD to fabricate insulating layers of semiconductor IC devices, that have improved step coverage.

2. Description of the Related Art

Chemical vapor deposition, herein referred to as CVD, is a thin film deposition procedure for forming solid material over the surface of a semiconductor wafer, utilizing a reactant (usually in the form of a gas). Various types of thin film, necessary for almost any semiconductor component, can be formed using CVD procedures. In addition to providing insulating layers for separating conducting regions in the semiconductor device being fabricated, insulating thin films may also be used to provide protection layers for circuit components fabricated over the surface of the semiconductor wafer.

FIG. 1 of the accompanying drawings schematically shows the reaction mechanism carried out in a typical CVD procedure. Initially, molecules in the main stream of the reactant gaseous flow, generally indicated by the reference numeral 46, are transferred by diffusion to the surface of the semiconductor device wafer 50 via the boundary layer 48. This diffusion phenomena is caused by the presence of a concentration gradient established between the main stream 46 and the surface of the device wafer 50.

The transfer, as schematically indicated by the downward arrow (1), brings reactant molecules to the surface of the device wafer 50, so that the reactant molecules are absorbed by the wafer surface, as schematically indicated at (2). The absorbed reactant molecules are deposited over the surface of the device wafer 50 in a chemical reaction triggered by the energy provided at the surface of the device wafer 50, as schematically indicated at (3). When the deposition reaction is complete, its byproducts, as well as some reactant molecules that do not participate in the deposition reaction, are released back to the main stream 46 of the reactant gaseous flow via the boundary layer according to a desorption phenomenon, as schematically indicated at (4). These desorbed byproducts and returned reactant molecules are then expelled from the reaction chamber of the CVD apparatus by the pumping of a vacuum system.

The greater portion of the deposition achieved by the absorption phenomenon is a result of an exothermic reaction at the surface of the device wafer. The temperature of the device wafer surface therefore constitutes the major controlling factor of the deposition reaction. Essentially, the lower is the device wafer surface temperature, the greater is the absorption rate, which can be translated into a greater deposition rate of the solid deposited material.

A conventional CVD apparatus is schematically shown in the top view of FIG. 2. The layout shows that the conventional CVD apparatus 1 includes a buffer chamber 60 for temporarily housing a wafer 50 carried by a transport arm 62. At least one reaction chamber 66 (two are shown in FIG. 2), are arranged at the periphery of the buffer chamber 60, and are connected to the buffer chamber 60 via communicating access doors 64. The transport arm 62 may be used to transport the wafer 50 into one of the connected reaction chambers 66 via the corresponding door 64, for performing the CVD procedure. When the CVD procedure concludes, the transport arm 62 may also be used to retrieve the wafer from the reaction chamber 66.

FIG. 4 schematically shows a cross section of a semiconductor device fabricated employing the conventional CVD procedure in an apparatus such as the one depicted in FIG. 2. The CVD procedure essentially includes the following steps: First, the required components (not shown in the drawing) are formed over the surface of the silicon substrate 10. A protective passivation layer 12 such as, for example, silicon dioxide is then formed over the surface of the substrate 10 to prevent damage to the substrate 10 and the components carried thereon. An electrically conductive layer such as, for example, an aluminum alloy is then deposited and is patterned into conductor segments 14 using photolithographic and etching procedures. Finally, the silicon substrate 10 is transported into the reaction chamber 66 of the above-described CVD apparatus. The CVD procedure conducted therein forms a flat insulating layer 16 of, for example, silicon dioxide over the surface of the conductive segments 14 and the exposed passivation layer 12.

In the prior art CVD procedures such as the one described above, step coverage achieved by the deposited insulating layer 16 is generally poor. This is because when the substrate 10 is transported into the reaction chamber 66 of the apparatus 1 (FIG. 2), both the passivation layer 12 and the conductors 14, to be covered by the deposited insulating layer 16, have essentially the same temperature. This results in similar absorption characteristics for both portions of the substrate surface, namely the conductor 14 and the passivation layer 12, when the CVD deposition procedure is initiated. The insulating layer 16 thus deposited would have substantially the same thickness above the passivation layer 12 and the conductors 14, resulting in poor step coverage.

SUMMARY OF THE INVENTION

It is therefore an object of the invention to provide a method and apparatus for performing CVD to fabricate insulating layers of semiconductor IC devices, having improved step coverage.

It is another object of the invention to provide a method and apparatus for performing CVD for fabricating insulating layers of semiconductor IC devices, wherein a controllable relative deposition ratio is obtained based on different temperatures at different locations of the deposited surface, in order to improve step coverage.

The invention achieves the above-identified objects by providing an apparatus for performing chemical vapor deposition (CVD) by depositing an insulating layer when fabricating semiconductor integrated circuit devices over a silicon wafer. The CVD apparatus includes: a buffer chamber for temporarily holding the wafer; at least one chemical vapor deposition reaction chamber, arranged at the periphery of the buffer chamber and communicating with the buffer chamber via a first access door; and a transport arm for transporting the wafer. The CVD apparatus also includes a heating chamber arranged at the periphery of the buffer chamber that communicates with the buffer chamber via a second access door in order to subject the wafer to a heating treatment before the wafer is deposited in the CVD reaction chamber. The transport arm serves to transport the wafer into and out of the heating chamber and at least one chemical vapor deposition reaction chamber.

The invention further achieves the above-identified objects by providing a method for performing a CVD procedure to deposit an insulating layer when fabricating semiconductor integrated circuit devices over a silicon wafer. The method includes the steps of first forming a passivation layer over a surface of the silicon wafer, which contains components of the integrated circuit devices. A number of conductor segments are then formed over the surface of the passivation layer. Heat is then applied to the silicon wafer, so as to raise the temperature of the conductor segments higher than that of the passivation layer. Finally, a CVD procedure is applied to the silicon wafer to form a substantially flat insulating layer over the surface of both the conductor segments and the passivation layer.

BRIEF DESCRIPTION OF THE DRAWINGS

Other objects, features, and advantages of the invention will become apparent from the following detailed description of the preferred but non-limiting embodiments. The description is made with reference to the accompanying drawings, in which.

DESCRIPTION OF THE PREFERRED EMBODIMENTS

Figure 3:
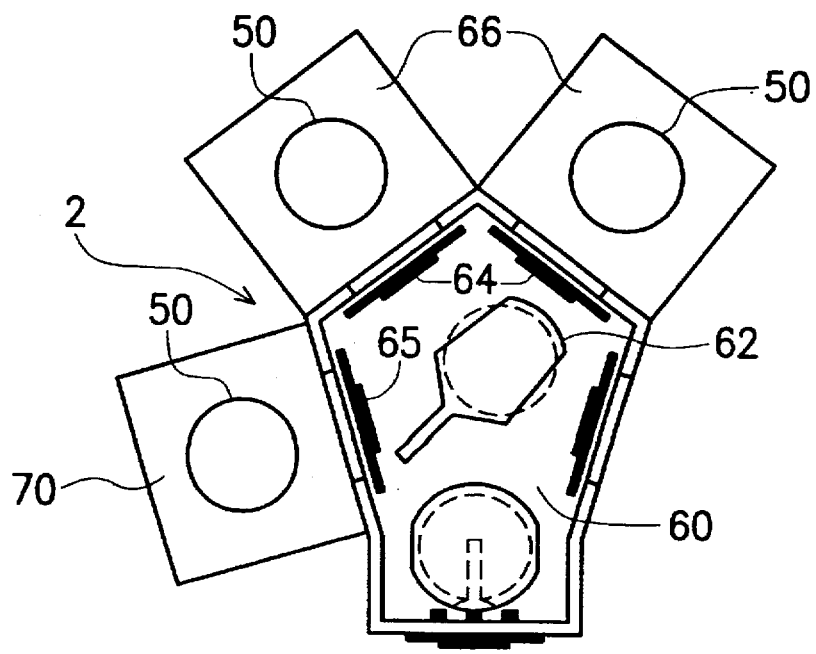
FIG. 3 is a top view showing the layout of a CVD apparatus in accordance with a preferred embodiment of the invention.
Figure 5:
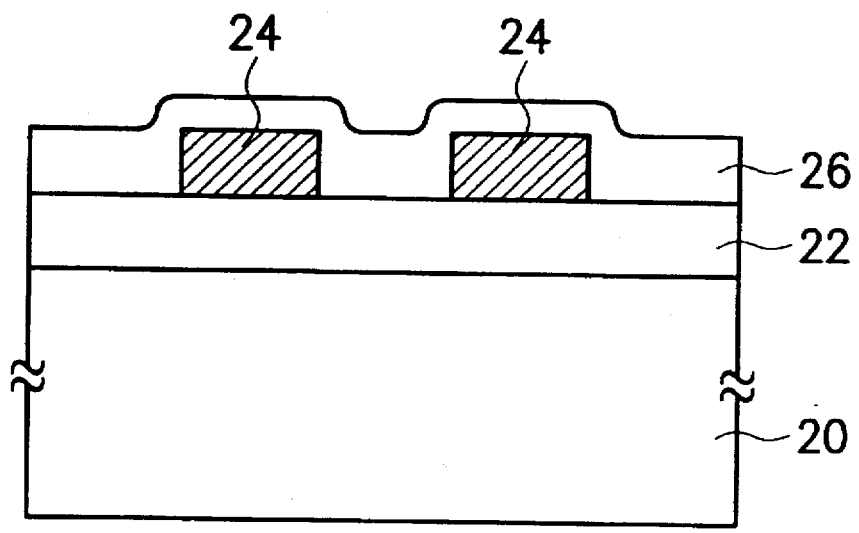
FIG. 5 schematically shows a cross section of a semiconductor device fabricated employing a CVD procedure in accordance with a preferred embodiment of the invention.

For a description of the preferred embodiments of the invention, reference is directed to FIGS. 3 and 5 of the accompanying drawing.

As is seen in FIG. 3, a CVD apparatus 2 of the invention includes a buffer chamber 60 for temporarily housing a wafer 50 carried by a transport arm 62. Two reaction chambers 66, arranged at the periphery of the buffer chamber 60, are connected to the buffer chamber 60 via a communicating access door 64. In some embodiments, only one, or more than two such reactor chambers may be provided. A heating chamber 70 is also arranged at the periphery of the buffer chamber 60, and is connected to the chamber 60 via its communicating access door 65.

The transport arm 62 may be used to transport the wafer 50 into one of the connected reaction chambers 66 for performing the CVD procedure. When the CVD procedure is concluded, the same transport arm 62 may also be used to retrieve the wafer 50 from the one reaction chamber 66. The transport arm 62 may also be used to transport the wafer 50 into and out of the heating chamber 70. As will be explained, a heating procedure is performed by the heating chamber 70 before the CVD deposition.

With reference to FIG. 5, the CVD procedure essentially includes the following steps, which may be controlled by any suitable control means not shown in the drawings: First, the required components, such as field-effect transistors and insulating layers, etc. (not shown in the drawing), are formed over the surface of the silicon substrate 20. A protective passivation layer 22 such as, for example, a layer of silicon dioxide, is then formed over the surface of the substrate 20 to prevent damage to the substrate 20 and the components carried thereon. An electrically conductive layer formed, for example, of an aluminum alloy, is then deposited, which is pattered into electrical conductor segments 24 in the subsequent photolithographic and etching procedures.

Next, before performing the CVD deposition, a heating procedure is performed. Essentially, under the control of the control means the wafer 50 is transported into the heating chamber 70 which heats the wafer at a temperature of about 300° to 400° C. for about 1 to 2 minutes. This brings the temperature of the conductors 24 higher than that of the passivation layer 22.

Finally, after the completion of the heating procedure, the silicon substrate 20 is transported into the reaction chamber 66 of the above-described CVD apparatus 2. CVD is performed therein at a suitable temperature, about 200° to 300 ° C., to form a flat insulating layer 26 of, for example, silicon dioxide over the surface of the conductive segments 24 and the exposed passivation layer 22.

Thus, the CVD apparatus constructed in accordance with the preferred embodiment of the invention includes a heating chamber utilized to heat the device wafer before the deposition is actually performed. Since metals and their alloys are better thermal conductors than the material used for protective passivation layers, conductor segments formed over the surface of the device substrate are raised to a higher temperature than the passivation layer by the heating procedure.

Figure 1:
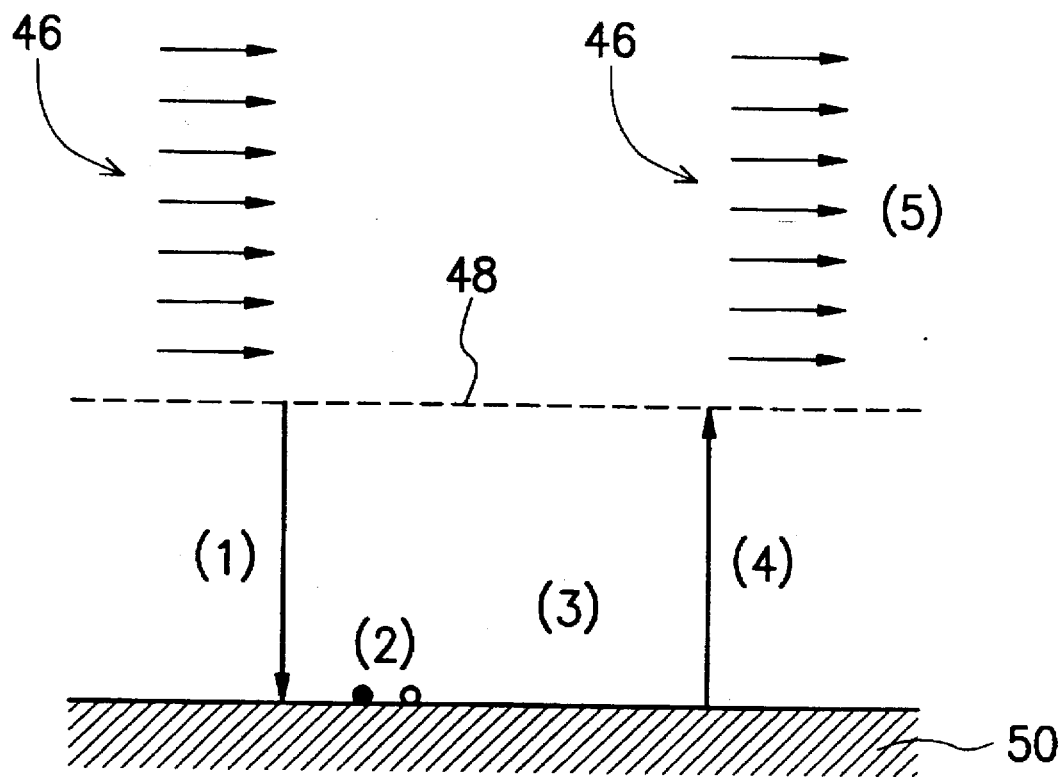
FIG. 1 schematically shows the reaction mechanism carried out in a conventional CVD procedure.
Figure 2:
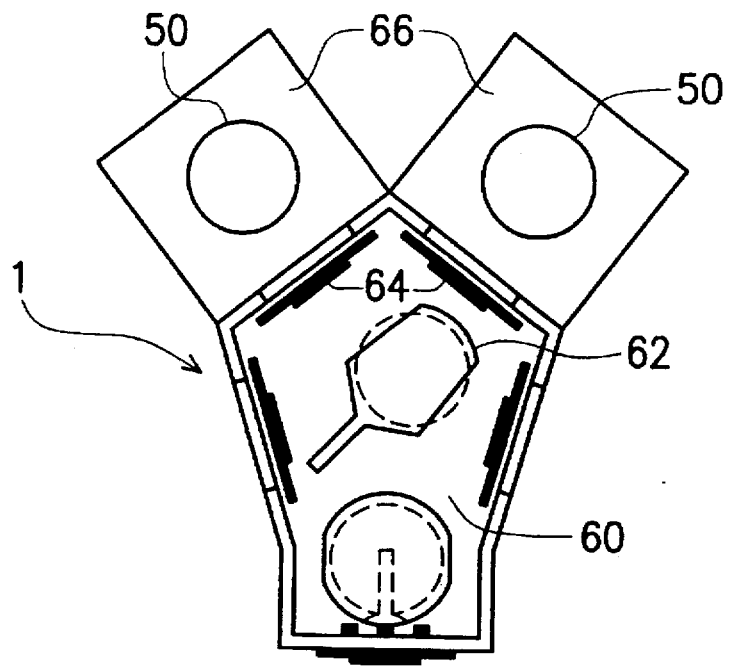
FIG. 2 is a top view of a conventional CVD apparatus.
Figure 4:
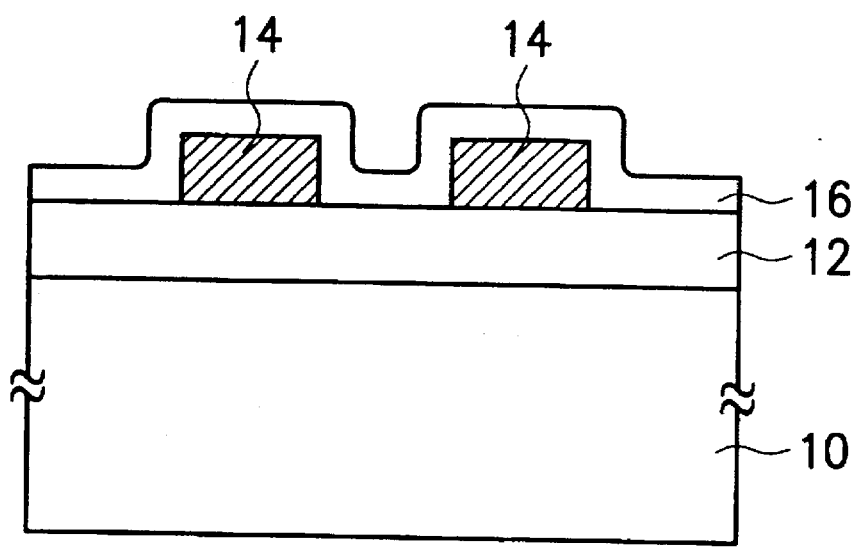
FIG. 4 schematically shows a cross section of a semiconductor device fabricated employing the conventional CVD procedure.

Based on the reaction mechanism for the chemical vapor deposition as described in connection to FIG. 1, temperature differences between different locations on the surface of the device substrate therefore result in different rates of deposition. Specifically, a lower temperature contributes to the rate of exothermic reaction that is characterized by the absorption phenomenon of the deposition reaction. The thickness of the deposited insulating layer produced over the regions of the passivation layer by the depicted embodiment is thicker than that over the conductor regions. This result can be seen from a comparison of the schematic depiction of FIG. 5 to that of FIG. 4. Better step coverage can thus be realized utilizing the method and apparatus of the invention for performing the CVD procedure in semiconductor device fabrications.

While the invention has been described by way of example and in terms of a preferred embodiment, it is to be understood that the invention is not limited to the disclosed embodiments. To the contrary, it is intended to cover various modifications and similar arrangements and procedures, and the scope of the appended claims should be accorded the broadest interpretation so as to encompass all such modifications and similar arrangements and procedures.

What is claimed is:

1. A method for performing a chemical vapor deposition procedure to deposit an insulating layer over a surface of a silicon wafer having components for integrated circuit devices located thereon, the method comprising the steps of:

forming a passivation layer over the surface of the silicon wafer and the components located thereon;

forming a plurality of conductor segments over a surface of the passivation layer;

heating the silicon wafer, so as to raise the temperature of the conductor segments higher than the temperature of the passivation layer; and after said step of heating, performing a chemical vapor deposition on the silicon wafer while the temperature of the conductor segments is higher than the temperature of the passivation layer, to form a substantially flat insulating layer over surfaces of both the conductor segments and the passivation layer.

2. The method of claim 1, wherein said step of performing chemical vapor deposition is performed at a temperature of about 200° to 300 ° C.

3. A method for performing a chemical vapor deposition procedure to deposit an insulating layer over a surface of a silicon wafer having components for integrated circuit devices located thereon, the method comprising the steps of:

forming a passivation layer over the surface of the silicon wafer and the components located thereon;

forming a plurality of spaced apart conductor segments over a surface of the passivation layer;

heating the silicon wafer in a heating chamber, so as to raise the temperature of the conductor segments higher than the temperature of the passivation layer; and transferring the silicon wafer from the heating chamber to a reaction chamber, performing a chemical vapor deposition on the silicon wafer in the reaction chamber, while the temperature of the conductor segments is higher than the temperature of the passivation layer, to form an insulating layer over surfaces of the conductor segments and over surfaces of the passivation layer between the conductor segments, such that the insulating layer is thicker over the passivation layer between the conductor segments than over the conductor segments.

4. The method of claim 3, wherein said step of heating is performed at a temperature of about 300° to 400 ° C. and sustained for about 1 to 2 minutes.

5. The method of claim 4, wherein said step of performing chemical vapor deposition is performed at a temperature of about 200° to 300 ° C.

6. The method of claim 3, wherein said step of performing chemical vapor deposition is performed at a temperature of about 200° to 300 ° C.

7. A method for performing a chemical vapor deposition procedure to deposit an insulating layer over a surface of a silicon wafer having components for integrated circuit devices located thereon, the method comprising the steps of:

forming a passivation layer over the surface of the silicon wafer and the components located thereon;

forming a plurality of conductor segments over a surface of the passivation layer;

heating the silicon wafer at a temperature of about 300° to 400 ° C. and sustained for about 1 to 2 minutes, so as to raise the temperature of the conductor segments higher than the temperature of the passivation layer; and after said step of heating, performing a chemical vapor deposition on the silicon wafer, to form a substantially flat insulating layer over surfaces of both the conductor segments and the passivation layer.

\* \* \* \* \*